United States Patent
Wang

(10) Patent No.: US 8,524,054 B2
(45) Date of Patent: *Sep. 3, 2013

(54) LOADING DEVICE AND SPUTTERING DEVICE USING SAME

(75) Inventor: Chung-Pei Wang, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 110 days.

This patent is subject to a terminal disclaimer.

(21) Appl. No.: 13/091,136

(22) Filed: Apr. 21, 2011

(65) Prior Publication Data

US 2012/0160675 A1    Jun. 28, 2012

(30) Foreign Application Priority Data

Dec. 24, 2010    (TW) ................................ 099145756

(51) Int. Cl.
| | |
|---|---|
| C23C 16/00 | (2006.01) |
| C23C 14/00 | (2006.01) |
| C25B 9/00 | (2006.01) |
| C25B 11/00 | (2006.01) |
| C25B 13/00 | (2006.01) |
| B23Q 3/18 | (2006.01) |
| B25B 1/06 | (2006.01) |
| B25B 1/16 | (2006.01) |

(52) U.S. Cl.
USPC ............ 204/298.27; 204/298.15; 204/298.23; 204/298.28; 118/729; 118/730; 269/61; 269/222

(58) Field of Classification Search
USPC ............... 118/729, 730; 204/298.23, 298.27, 204/298.28, 298.29, 298.15; 269/61, 222
See application file for complete search history.

(56) References Cited

U.S. PATENT DOCUMENTS

| | | | | |
|---|---|---|---|---|
| 4,411,763 | A * | 10/1983 | Itaba et al. ............... | 204/298.06 |
| 6,471,837 | B1 * | 10/2002 | Hans et al. ............... | 204/298.41 |
| 6,494,997 | B1 * | 12/2002 | Israel et al. .............. | 204/192.12 |
| 8,110,078 | B2 * | 2/2012 | Ito et al. ................... | 204/298.15 |
| 8,241,473 | B2 * | 8/2012 | Wang ....................... | 204/298.15 |
| 2011/0278164 | A1 * | 11/2011 | Wang ....................... | 204/298.07 |
| 2012/0097103 | A1 * | 4/2012 | Wang ........................... | 118/722 |
| 2012/0097106 | A1 * | 4/2012 | Wang ........................... | 118/730 |

FOREIGN PATENT DOCUMENTS

JP    03264667 A   * 11/1991

* cited by examiner

*Primary Examiner* — Michael Band
(74) *Attorney, Agent, or Firm* — Altis Law Group, Inc.

(57) ABSTRACT

A sputtering device includes a main body and a loading device received in the main body. The main body includes a top portion, a bottom portion, and a sidewall connected between the top portion and the bottom portion, an upper bearing mounted on the top portion, and a lower bearing mounted on the bottom portion. The loading device includes an outer frame, an inner frame received in the outer frame, and a gear device arranged between the outer frame and the in inner frame. The outer frame is rotatably connected to the upper bearing and includes a plurality of first rods arranged in a first circle. The inner frame is rotatably connected to the lower bearing and includes a plurality of second rods arranged in a second circle. The gear device is configured for bringing the outer frame and the inner frame to rotate in opposite directions.

5 Claims, 3 Drawing Sheets

LOADING DEVICE AND SPUTTERING DEVICE USING SAME

BACKGROUND

1. Technical Field

The present disclosure relates to sputtering devices and, particularly, to a loading device and a sputtering device using the same.

2. Description of Related Art

Sputtering devices usually include a loading device. The loading device usually includes a rotary plate and a plurality of rods mounted on the rotary plate. The rods are arranged in a circle and configured for loading workpieces. In use, a motor rotates the rotary plate so that the workpieces can be uniformly coated. To increase coating efficiency, more rod circles are needed. However, this can cause interference between the rods in different circles, thereby degrading the coating uniformity of the workpieces.

Therefore, it is desirable to provide a loading device and a sputtering device using the same that can overcome the described limitations.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present disclosure.

DETAILED DESCRIPTION

Figure 1:
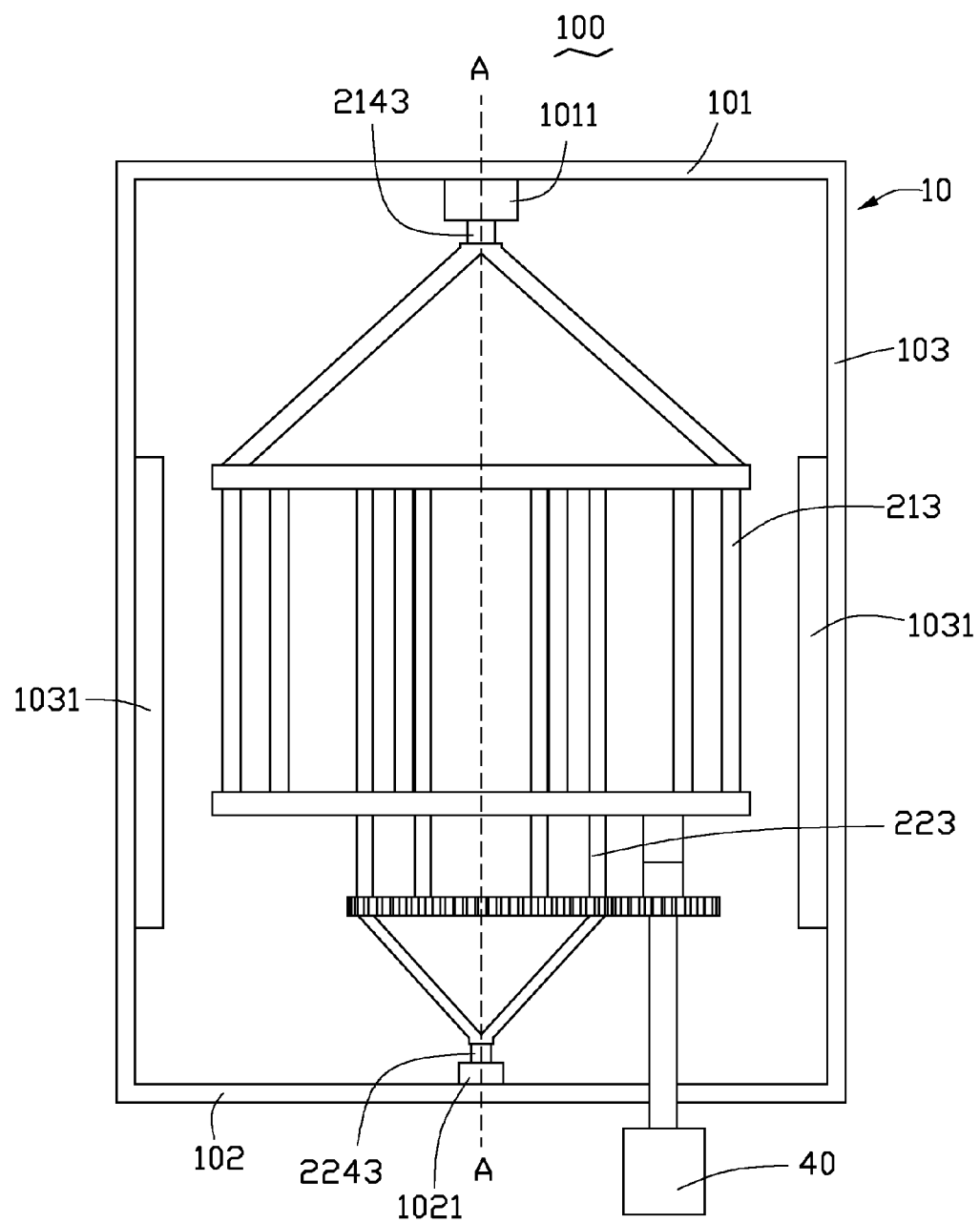
FIG. 1 is a schematic view of a sputtering device including a loading device, according to an exemplary embodiment.
Figure 2:
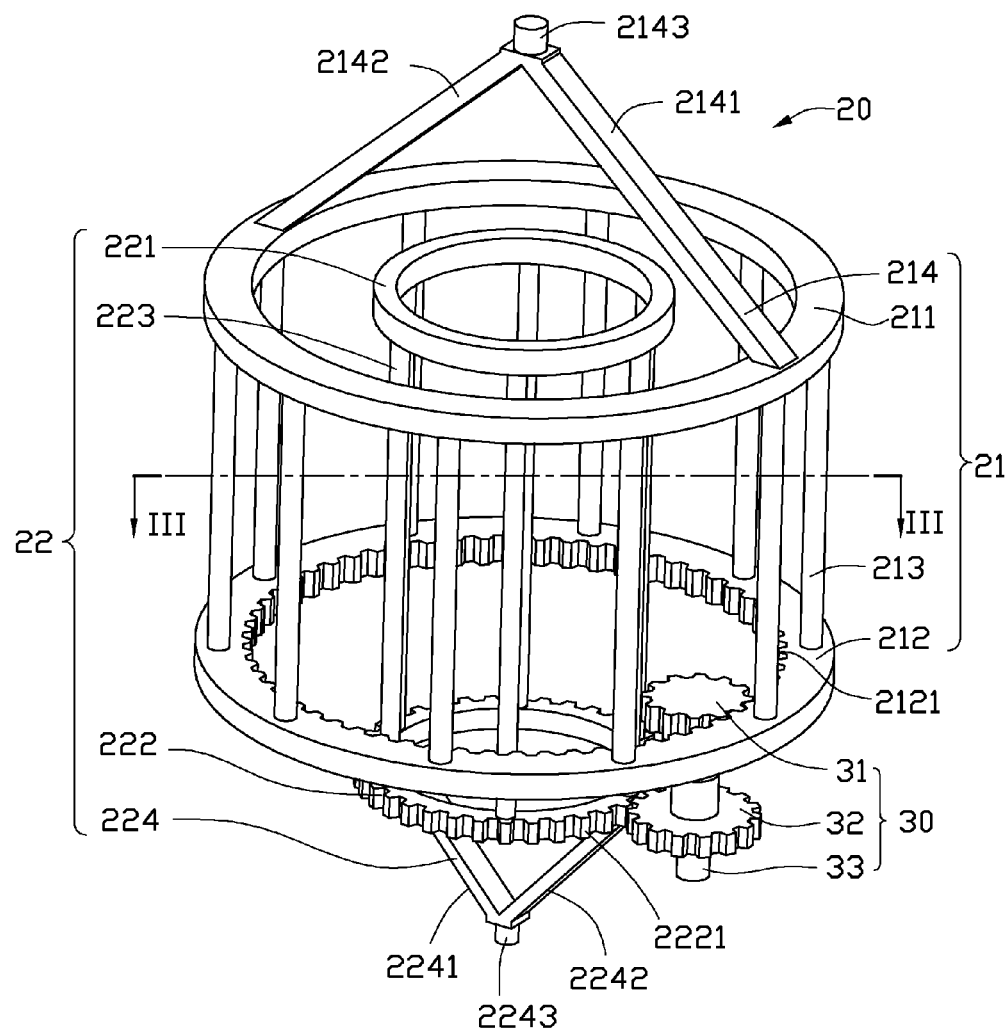
FIG. 2 is an isometric, schematic view of the loading device of the sputtering device of FIG. 1.
Figure 3:
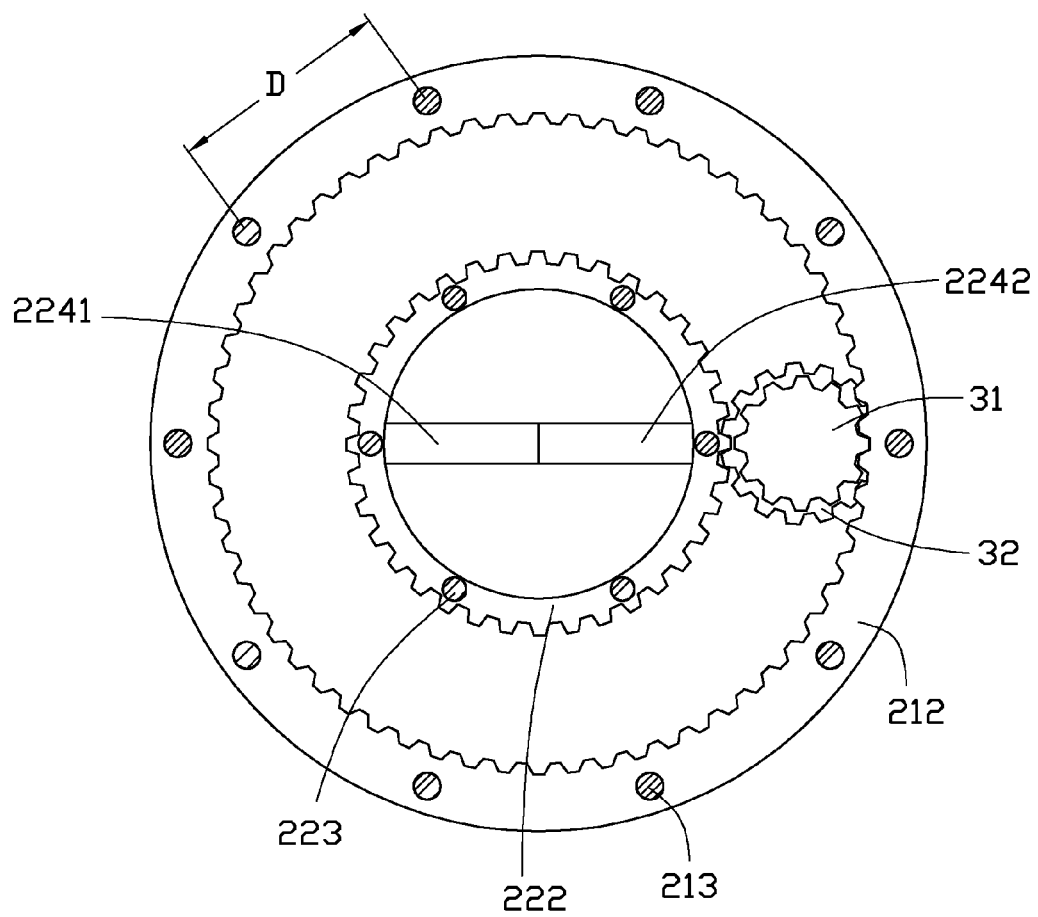
FIG. 3 is a cross-sectional, bottom view of the loading device along line III-III of FIG. 2.

Referring to FIGS. 1-3, a sputtering device 100, according to an exemplary embodiment, includes a main body 10, a loading device 20, a gear device 30, and a driving device 40.

The main body 10 is substantially a hollow cylinder and includes a plate-shaped top portion 101, a plate-shaped bottom portion 102 opposite to the top portion 101, and a tubular sidewall 103 perpendicularly connecting the top portion 101 and the bottom portion 102. The top portion 101 is parallel to the bottom portion 102. An upper bearing 1011 is mounted on the inner surface of the top portion 101. A lower bearing 1021 is mounted on the inner surface of the lower portion 102. The upper bearing 1011 is coaxial with the lower bearing 1021 along an axis A-A. A pair of target members 1031, opposite to each other, are mounted on the inner surface of the sidewall 103. In alternative embodiments, only one target 1031 can be employed instead and is mounted on the inner surface of the sidewall 103.

The loading device 20 includes an outer frame 21 and an inner frame 22. The outer frame 21 includes a first plate 211, a second plate 212, a plurality of first rods 213, and an upper connection portion 214. The first plate 211 and the second plate 212 are ring-shaped and coaxial with each other along the axis A-A. The first plate 211 is adjacent to the top portion 101. The second plate 212 is adjacent to the bottom portion 102 and comprises an inner circumferential surface and an outer circumferential surface. The inner circumferential surface of the second plate 212 is toothed and forms a plurality of inner teeth 2121. The first rods 213 are uniformly arranged between the first plate 211 and the second plate 212 and generally arranged in a first circle. The distance between two adjacent first rods 213 is designated as "D". Each of the first rods 213 is generally a circular rod and includes two ends, which are rotatably connected respectively to the first plate 211 and the second plate 212. Each first rod 213 is configured for loading workpieces (not shown). The upper connection portion 214 includes a first pole 2141, a second pole 2142 connecting with the first pole 2141, and an upper shaft portion 2143 positioned at the joint between the first pole 2141 and the second pole 2142. The free ends of the first pole 2141 and the second pole 2142 are connected to the first plate 211 and are opposite to the first rods 213. The upper shaft portion 2143 is configured to rotatably connect to the upper bearing 1011.

The inner frame 22 is received in the outer frame 21 and includes a third plate 221, a fourth plate 222 coaxial with the third plate 221 and the first plate 211, a plurality of second rods 223, and an lower connection portion 224. The third plate 221 and the fourth plate 222 are ring-shaped and respectively adjacent to the top portion 101 and the bottom portion 102. The fourth plate 222 comprises an inner circumferential surface and an outer circumferential surface. The outer circumferential surface of the fourth plate 222 is toothed and forms a plurality of outer teeth 2221. The second rods 223 are configured for loading workpieces and uniformly arranged between the third plate 221 and the fourth plate 222 generally in a second circle. Each of the second rods 213 is generally circular and includes two ends rotatably connected to the third plate 221 and the fourth plate 222. The diameter of each second rod 223 is less than the distance D. The lower connection portion 224 includes a third pole 2241, a fourth pole 2242 connecting with the third pole 2241, and an lower shaft portion 2243 positioned at the joint between the third pole 2241 and the fourth pole 2242. The free ends of the third pole 2241 and the fourth pole 2242 are connected to the fourth plate 222 and are opposite to the second rods 223. The lower shaft portion 2243 is configured for rotatably connecting to the lower bearing 1021.

The gear device 30 is arranged between the outer frame 21 and the inner frame 22. The gear device 30 includes an upper gear 31, a lower gear 32 coaxial with the upper gear 32, and a rotary shaft 33 connecting the upper gear 31 and the lower gear 32. The upper gear 31 is mounted to one end of the rotary shaft 33. The upper gear 31 engages with the inner teeth 2121. The lower gear 32 is adjacent to the upper gear 31 and mounted to the rotary shaft 33, with the rotary shaft 33 passing through the center of the lower gear 32. The lower gear 32 gearingly engages with the outer teeth 2221. The rotary shaft 33 is capable of being rotated to bring the upper gear 31 to simultaneously rotate with the lower gear 32. The other end of the rotary shaft 33 away from the upper gear 31 is connected to the driving device 40.

The driving device 40 is mounted the outside of the main body 10 and configured for driving the rotary shaft 33 to rotate. In this embodiment, the driving device 40 is a motor.

In a coating process, workpieces are loaded on the first rods 213 and the second rods 223. The driving device 40 brings the gear device 30 to rotate. Particles of the target members 1031 sputter to the outer frame 21 and the inner frame and deposit on the workpieces. The upper gear 31 brings the second plate 212 to rotate about the axis A-A. The lower gear 32 brings the fourth plate 222 to rotate about the axis A-A along a direction opposite to the direction that the outer frame 21 rotates. Thus, the first rods 213 rotate about the axis A-A opposite to the rotation of the second rods 223. The diameter of each second rod 223 is less than the distance D. Each second rod 223 can move to the gaps between two neighboring first rods 213.

Thus, the first rods 213 do not block the particles from the target members 1031 when sputtering to the second rods 223. The workpieces loaded on the first rods 213 and on the second rods 223 can be uniformly coated.

It will be understood that the sputtering device 100 can include two gear devices, each gear device includes a motor, a rotary shaft, and a gear. The two gear devices are configured for respectively driving the second plate 212 and the fourth plate 222 to rotate.

It will be understood that the second plate 212 and the fourth plate 222 can be formed at the same horizontal height. The gear device 30 can only include a gear simultaneously engaging the inner teeth 2121 with the outer teeth 2221.

It will be understood that the above particular embodiments are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. A sputtering device, comprising:
a hollow main body comprising:
a top portion;
a bottom portion opposite to the top portion;
a sidewall connecting between the top portion and the bottom portion;
an upper bearing mounted on the top portion; and
a lower bearing mounted on the bottom portion;
a loading device received in the hollow main body and comprising:
an outer frame rotatably connected to the upper bearing, the outer frame comprising a plurality of first rods arranged in a first circle, a first plate adjacent to the top portion and a second plate adjacent to the bottom portion, the first rods arranged between the first plate and the second plate, each of the first rods comprising two ends connected to the first plate and the second plate;
an inner frame received in the outer frame and rotatably connected to the lower bearing, the inner frame comprising a plurality of second rods arranged in a second circle, the inner frame comprising a third plate adjacent to the top portion and a fourth plate adjacent to the bottom portion, the second rods arranged between the third plate and the fourth plate, each of the second rods comprising two ends respectively connected to the third plate and the fourth plate;
a gear device arranged between the outer frame and the inner frame, the gear device being configured for bringing the outer frame and the inner frame to rotate in opposite directions, the gear device comprises a rotary shaft, an upper gear, and a lower gear, the upper gear is mounted to one end of the rotary shaft and engages with a plurality of inner teeth, the lower gear is adjacent to the upper gear and mounted to the rotary shaft, the rotary shaft passes through the a center of the lower gear, the lower gear engages with a plurality of outer teeth; and
a driving device connected to the other end of the rotary shaft away from the upper gear, wherein the second plate comprises an inner circumferential surface, the inner circumferential surface is toothed and forms the plurality of inner teeth, the fourth plate comprises an outer circumferential surface, the outer circumferential surface is toothed and forms the plurality of outer teeth, the driving device brings the gear device to rotate, the upper gear brings the second plate to rotate, the lower gear brings the fourth plate to rotate along a direction opposite to the direction that the outer frame rotates, the first rods rotate opposite to the rotation of the second rods.

2. The sputtering device of claim 1, wherein the outer frame comprise an upper connection portion, the upper connection portion comprises a first pole, a second pole connecting with the first pole, and a upper shaft portion positioned at a joint between the first pole and the second pole, the free ends of the first pole and the second pole are connected to the first plate and are opposite to the first rods, the upper shaft portion is roatably connect to the upper bearing.

3. The sputtering device of claim 1, wherein the outer frame comprises an lower connection portion, the lower connection portion comprises a third pole, a fourth pole connecting with the third pole, and a lower shaft portion positioned at a joint between the third pole and the fourth pole, the free ends of the third pole and the fourth pole are connected to the fourth plate and are opposite to the second rods, the lower shaft portion is roatably connected to the lower bearing.

4. The sputtering device of claim 1, wherein the upper bearing is coaxial with the lower bearing.

5. The sputtering device of claim 1, wherein a distance between two adjacent first rods is greater than a diameter of each second rod.

* * * * *